United States Patent
Inoue (10) Patent No.: US 8,085,579 B2
(45) Date of Patent: Dec. 27, 2011

(54) SEMICONDUCTOR MEMORY DEVICE (75) Inventor: Akimitsu Inoue, Toyota (JP)

(73) Assignee: DENSO CORPORATION, Kariya (JP)

( * ) Notice: Subject to any disclaimer, the term of this patent is extended or adjusted under 35 U.S.C. 154(b) by 379 days.

(21) Appl. No.: 12/382,875

(22) Filed: Mar. 26, 2009

(65) Prior Publication Data
US 2009/0244956 A1    Oct. 1, 2009

(30) Foreign Application Priority Data

Mar. 27, 2008 (JP) ................ 2008-083798
Nov. 19, 2008 (JP) ................ 2008-295502

(51) Int. Cl.
*G11C 11/00* (2006.01)
(52) U.S. Cl. .............. 365/154; 365/156; 365/226
(58) Field of Classification Search ............ 365/154, 365/156, 226
See application file for complete search history.

(56) References Cited

U.S. PATENT DOCUMENTS

| | | | |
|---|---|---|---|
| 5,418,749 A | 5/1995 | Suda et al. | |
| 5,600,588 A | 2/1997 | Kawashima | |
| 6,999,338 B1 | 2/2006 | Hirabayashi | |
| 7,079,413 B2 * | 7/2006 | Tsukamoto et al. | 365/154 |
| 7,639,525 B2 * | 12/2009 | Yamaoka et al. | 365/154 |
| 7,706,173 B2 * | 4/2010 | Ikeda | 365/154 |
| 2002/0097617 A1 | 7/2002 | Senda et al. | |
| 2003/0160649 A1 | 8/2003 | Nakai | |
| 2004/0238875 A1 | 12/2004 | Nakai | |
| 2007/0047348 A1 | 3/2007 | Satomi | |
| 2007/0211545 A1 | 9/2007 | Otsuka et al. | |
| 2007/0280009 A1 | 12/2007 | Otsuka et al. | |

FOREIGN PATENT DOCUMENTS

| | | |
|---|---|---|
| JP | A-06-005081 | 1/1994 |
| JP | A-2000-174611 | 6/2000 |
| JP | A-2003-123479 | 4/2003 |

OTHER PUBLICATIONS

Office Action dated Nov. 16, 2010 in corresponding JP patent application No. 2008-295502 (English translation enclosed).
The Reason for Rejection issued from the Japanese Patent Office on Feb. 2, 2010 in the corresponding Japanese patent application No. 2008-295502 (with English translation thereof).

* cited by examiner

*Primary Examiner* — Tuan T Nguyen
*Assistant Examiner* — Toan Le
(74) *Attorney, Agent, or Firm* — Posz Law Group, PLC (57) ABSTRACT

In a memory cell, a margin for data preservation is provided while suppressing a current consumption associated with a low-power consumption mode. A MOS transistor has the same structure as NMOS transistors included in each of memory cells. When a low-power consumption mode is designated, a voltage developed at a node is stabilized by subtracting a margin voltage for data preservation across a first resistor from a voltage applied to a first node and by subtracting a threshold voltage of the MOS transistor from the resultant voltage is applied to a second node.

19 Claims, 7 Drawing Sheets

SEMICONDUCTOR MEMORY DEVICE

CROSS REFERENCE TO RELATED APPLICATIONS

The present application is based on and claims priority to Japanese Applications JP 2008-083798, filed on Mar. 27, 2008, and JP 2008-295502, filed on Nov. 19, 2008, the contents of which are incorporated herein by reference.

BACKGROUND OF THE INVENTION

1. Field of the Invention

The present invention relates to a semiconductor memory device and, more specifically, for reducing current consumption and preserving stored data when a low-power consumption mode is designated.

2. Description of the Related Art

In the technological field of semiconductor memory devices, there is always a demand for low current consumptive devices. A technology has been developed, for example, as described in JP-A-2000-174611, in which a bias voltage is applied to the sources of memory transistors included in a memory cell in order to suppress a current consumption required by the memory device when a low-power consumption mode is designated. The bias voltage to be applied to the sources is presumably set to a rather small value in consideration of a maximum variance in the threshold voltage Vt of the memory transistors so that the data in the memory cell can be preserved.

Since the effect of a bias voltage applied to a substrate is limited, if the threshold voltage Vt is decreased due to a variance caused by high temperature or a manufacturing process, a margin for data preservation becomes excessively large, however, a reduction in a standby current consumption is restricted. In contrast, when the threshold voltage Vt is increased, assuming that the bias voltage to be applied to the sources is set to a rather large value in order to reduce the standby current consumption, the margin for data preservation decreases.

In recent years, the capacity of semiconductor memory devices has increased, and design rules for processes have been contracted. A standby current consumption associated, for example, with a low-power consumption mode tends to pose a problem because of an off-leakage current of a metal-oxide semiconductor (MOS) transistor. Accordingly, there is an increasing demand to suppress the standby current consumption while preserving the data in the memory.

SUMMARY OF THE INVENTION

The various inventive embodiments described in the present application address the above described and other situations, and provide a semiconductor memory device capable of ensuring a margin for data preservation while suppressing a current consumption required when, for example, a low-power consumption mode is designated.

According to one aspect, each of static random-access memory (SRAM) cells includes memory cell transistors. A regulation circuit regulates a voltage applied to the sources or the back gates of the memory cell transistors so that even when the threshold voltage of the memory cell transistors included in each of the SRAM cell fluctuates, a margin for turning on of the memory cell transistors can always be retained at a certain value. While a standby current consumption is suppressed by reducing leakage currents of the memory cell transistors due to an effect of a bias voltage applied to a substrate, a stable margin for data preservation can be ensured.

In accordance with another aspect, each of SRAM cells includes memory cell transistors. Each of detection circuits detects the threshold voltage of the memory cell transistors. A regulation circuit regulates a voltage applied to the sources or the back gates of the memory cell transistors, on the basis of the result of the detection performed by each of the detection circuits. The value of the margin for data preservation can therefore be controlled.

In accordance with another aspect, voltages to be applied to the back gates of p-channel metal-oxide semiconductor (PMOS) out of the memory cell transistors included in the SRAM cell, and to the sources thereof can be applied independently of each other. An effect of a bias voltage applied to a substrate can be exerted in the PMOS transistors. The leakage currents of the memory cell transistors can be suppressed and a standby current consumption can be reduced.

In accordance with another aspect, voltages to be applied to the back gates of n-channel MOS (NMOS) transistors out of the memory cell transistors included in the SRAM cell and to the sources thereof can be applied independently of each other. The effect of a bias voltage applied to a substrate can be exerted in the NMOS transistors. The leakage currents of the memory cell transistors can be suppressed, and the standby current consumption can be reduced.

In accordance with another aspect, each of SRAM cells has the sources of first and second PMOS transistors connected in common with each other at a first node, and has the sources of first and second NMOS transistors connected in common with each other at a second node. Herein, each of third NMOS transistors has the same structure as the first and second NMOS transistors included in each of the SRAM cells do. When a low-power consumption mode is designated, a voltage is applied to the second node on the basis of the threshold voltage of the third NMOS transistor. Therefore, when the low-power consumption mode is designated, a current consumption caused by the off-leakage currents of the first and second NMOS transistors can be suppressed. An almost constant margin for turning on of the first and second NMOS transistors can be ensured at all times irrespective of a variance in the threshold voltage.

In accordance with another aspect, since multiple third NMOS transistors are connected in parallel with one another, the threshold voltage values of the third NMOS transistors can be averaged in order to suppress an adverse effect of a variance in a semiconductor chip to the greatest possible extent.

In accordance with another aspect, as long as the first to third NMOS transistors are arrayed within a memory cell region, the first to third NMOS transistors can be readily fabricated to share the same characteristic. In other words, the characteristics of the NMOS transistors can be almost squared with one another.

In accordance with another aspect, a first voltage application circuit applies a voltage higher than a voltage to be applied to the back gate of the first NMOS transistor and to the back gate of the second NMOS transistor, to the second node, the off-leakage currents of the first and second NMOS transistors are decreased owing to an effect of a bias voltage. A current consumption required when a low-power consumption mode is designated can be suppressed.

In accordance with another aspect, a second voltage application circuit applies a voltage to the first node according to the voltage to be applied to the second node by the first voltage application circuit. The off-leakage currents of the NMOS transistors and PMOS transistors can be simultaneously controlled to be decreased in consideration of a margin for turning on.

In accordance with another aspect, the second voltage application circuit includes third PMOS transistors that have the same layout structure as the first and second PMOS transistors do. Since the second voltage application circuit applies a voltage to the first node on the basis of the threshold voltage of the third PMOS transistors, an almost constant margin for turning on can be ensured at all times irrespective of a variance in the threshold voltage of the first and second PMOS transistors.

In accordance with another aspect, since multiple third PMOS transistors are connected in parallel with one another, the threshold voltage values of the third PMOS transistors can be averaged in order to suppress an adverse effect of a variance in a semiconductor chip to the greatest possible extent.

In accordance with another aspect, as long as the first to third PMOS transistors are arrayed in a memory cell region, the first to third PMOS transistors can be fabricated to share the same characteristic, or in other words, the characteristics of the PMOS transistors can be almost squared with one another. Since the second voltage application circuit applies a voltage lower than a voltage to be applied to the back gate of the first PMOS transistor and to the back gate of the PMOS transistor, to the first node, a current consumption caused by the off-leakage currents of the first and second PMOS transistors when a low-power consumption mode is designated can be suppressed. Still further, a thin-film silicon-on-insulator (SOI) structure may be adopted.

BRIEF DESCRIPTION OF THE DRAWINGS

Other objects, features and characteristics of the present invention will be appreciated and become apparent to those of ordinary skill in the art and all of which form a part of the present application. In the drawings.

DETAILED DESCRIPTION OF THE EXEMPLARY EMBODIMENTS

First Embodiment

Figure 1:
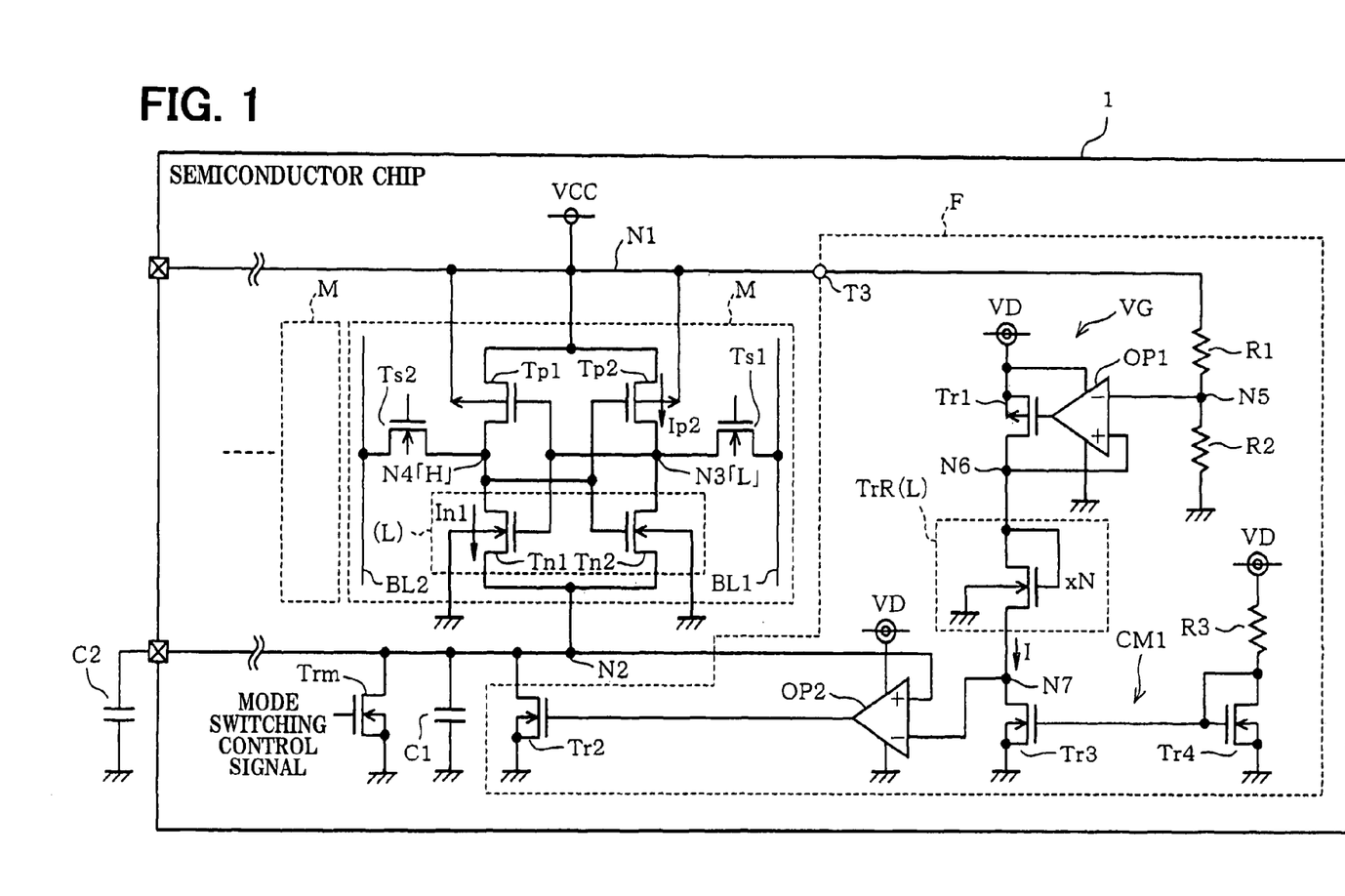
FIG. 1 is a schematic diagram illustrating an exemplary constitution of a semiconductor memory device in accordance with a first embodiment.
Figure 2:
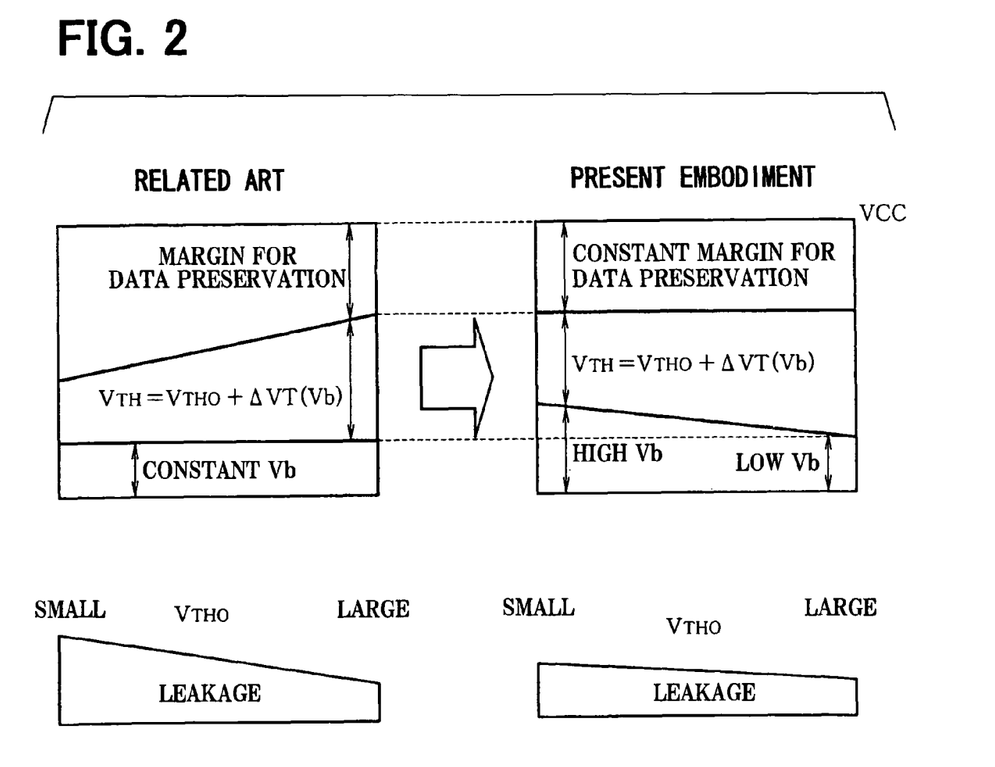
FIG. 2 is a diagram illustrating an exemplary comparison associated with a change in a margin for data preservation with respect to a threshold voltage.

Referring to FIG. 1 and FIG. 2, a first embodiment involves a semiconductor memory device that employs a static random access memory (SRAM) cell as will be described below.

FIG. 1 is a circuit diagram showing the electrical constitution of a fully complementary metal-oxide semiconductor (CMOS) type SRAM and a regulation circuit that regulates a source potential. The semiconductor memory device is included in a system that may be mounted in a vehicle and that operates while being externally powered with a predetermined voltage such as, for example, 5 V.

An exemplary semiconductor memory device may be embodied as semiconductor chip 1. Numerous memory cells M are formed as a matrix on, for example, a thin-film silicon-on-insulator (SOI) substrate (not shown). FIG. 1 shows one of the memory cells M. The memory cell M preserves data when having a memory cell supply voltage VCC of, for example, 1.2 V applied thereto. The memory cell M includes an inverter pair including a first CMOS inverter composed of a transistor pair including an n-channel MOS (NMOS) transistor Tn1 and a p-channel MOS (PMOS) transistor Tp1, and a second CMOS inverter composed of a transistor pair including an NMOS transistor Tn2 and a PMOS transistor Tp2.

The sources of transistors Tp1 and Tp2 are connected in common with each other at a high-potential node N1. The drain of the transistor Tp1 is connected to the drain of the transistor Tn1, and the drain of the transistor Tp2 is connected to the drain of the transistor Tn2.

The gates of transistors Tp1 and Tn1 are connected in common with each other at a node N3 serving as a common junction point between the drain of the transistor Tp2 and the drain of the transistor Tn2.

The gates of transistors Tp2 and Tn2 are connected in common with each other at a node N4 serving as a common junction point between the drain of the transistor Tp1 and the drain of the transistor Tn1.

An n-channel transistor Ts1 for memory cell selection may be an NMOS field-effect transistor (FET). One of the drain or the source of the transistor Ts1 may be connected to a bit line BL1, and the other of the drain or source may be connected to the node N3. An n-channel MOS transistor Ts2 for memory cell selection may be an NMOSFET One of the drain or the source of the transistor Ts2 may be connected to a bit line BL2, and the other of the drain or the source may be connected to the node N4.

The back gates of the MOS transistors Tp1 and Tp2 are connected to the high-potential node N1, and the back gates of the MOS transistors Tn1 and Tn2 are connected to a predetermined low-potential ground node. Thus, the memory cell M is formed with a combination of the memory cell transistors such as the MOS transistors Tp1, Tp2, Tn1, and Tn2. A memory cell region can be formed from numerous memory cells M.

The sources of the MOS transistors Tn1 and Tn2 are connected in common with each other at a node N2 where a predetermined bias voltage is applied from an output terminal of a regulation circuit F that is also connected to the node N2. A capacitor C1 formed in the semiconductor chip 1 and a capacitor 2 formed outside the semiconductor chip 1 are connected between the node N2 and the ground. The capacitors C1 and C2 are included for stabilizing the potential at the node N2. Since the capacitor C2 outside the semiconductor chip 1 is connected to the node N2, a large capacitance can be readily attained.

An NMOS transistor Trm is interposed as a switching element between the node N2 and ground for mode switching to be used to support a low-power consumption mode, a standby mode of the system, and an operation mode thereof. The memory cell M is designed to permit mode switching between the operation mode and low-power consumption mode.

The regulation circuit F includes a step-down power supply circuit VG, NMOS transistors TrR connected to the output terminal of the step-down power supply circuit VG, and a current mirror circuit CM1 to be used to route a certain current I to the MOS transistors TrR. The step-down power supply circuit VG includes resistors R1 and R2 that divide the voltage VCC to produce a fraction of the voltage developed at the node N1, an operational amplifier OP1, and a p-channel MOS transistor Tr1.

The resistors R1 and R2 produce a predetermined voltage, for example, 0.9 V as a fraction of the voltage developed at the node N1, for example, 1.2 V. The fractional or predetermined voltage is applied to the inverting input terminal of the operational amplifier OP1. The operational amplifier OP1 is powered by a source of a supply voltage VD, for example, 5 V, and acts as a differential amplifier having the PMOS transistor Tr1 as a load. Specifically, assuming that the voltage developed at a node N5 serving as the input node of the operational amplifier OP1 is regarded as a reference voltage and the voltage developed at a node N6 serving as the output node of the step-down power supply circuit VG is regarded as an output voltage, the operational amplifier OP1 detects the potential difference between the reference voltage and output voltage, and controls a direct-current (DC) voltage or a direct current fed to the PMOS transistor Tr1, according to the result of the detection.

The n-channel MOS transistors TrR include N NMOS transistors that are connected to the node N6, and that may produce a diode effect, and that are connected in parallel with one another while being placed side by side with the respective pairs of NMOS transistors Tn1 and Tn2 included in the memory cells M within the memory cell region. Therefore, the NMOS transistors TrR are arranged in the form of a matrix while being positioned side by side with the respective pairs of the NMOS transistors Tn1 and Tn2. The MOS transistors TrR are used as circuits that detect the threshold voltages of the respective pairs of the NMOS transistors Tn1 and Tn2, and are formed as dummy transistors, measurement transistors, or detection circuits.

It should be noted that the MOS transistors TrR are disposed in the memory cell region and fabricated under the same process condition as the memory cell transistors Tn1 and Tn2 in order to exhibit the same temperature characteristic as the memory cell transistors Tn1 and Tn2 so as to more precisely measure the dependency of a variance in the threshold voltage Vt or the like of the memory cell transistors Tn1 and Tn2 on a process or temperature. It should be noted that the letter "L" in parentheses appended to the reference to TrR(L) denotes the transistors Tn1, Tn2, and TrR, which are positioned side by side with one another in the memory cell region in order to be provided with the same characteristic.

The current mirror circuit CM1 includes a resistor R3 and an n-channel MOS transistor Tr4 connected to the resistance R3, producing a diode effect. The resistor R3 and the Tr4 are connected in series with each other between the supply voltage source VD and ground, with the gate of a MOS transistor Tr3 being connected in common with the gate of the MOS transistor Tr4.

The MOS transistors TrR and MOS transistor Tr3 are connected in common with one another at a node N7, so that a current flowing between the drain and source of each of the transistors TrR will remain constant. The common junction point between the MOS transistors TrR and MOS transistor Tr3 is connected to the inverting input terminal of an operational amplifier OP2.

The operational amplifier OP2 acts as a differential amplifier, the output terminal thereof connected to an n-channel MOS transistor Tr2, and the non-inverting input terminal thereof connected to the node N2. Assuming that the voltage developed at the node N7 connected to the inverting input terminal of the operational amplifier OP2 is regarded as a reference voltage and the voltage developed at the node N2 connected to the non-inverting input terminal thereof is regarded as an output voltage, the operational amplifier OP2 detects a potential difference between the reference voltage and output voltage, and controls a DC voltage or a direct current fed to the MOS transistor Tr2, according to the result of the detection. Thus, the voltage across the terminals of each of the capacitors C1 and C2 is regulated. Eventually, the voltage developed at the node N2 when the MOS transistor Trm is off can be regulated and a certain bias voltage is applied to the sources connected to the node N2.

A feature of the present embodiment derived from the operation of the foregoing constitution will be described below.

When the above described constitution of the memory cells is adopted, even if the system is placed in a low-power consumption mode or the memory cells M are not accessed, leakage currents flow through each of the memory cells M. Along with increased process miniaturization, the threshold voltage Vt of the memory cell transistors Tn1 and Tn2 is set to a voltage lower than the conventional threshold. Therefore, the off-leakage currents give rise to an adverse effect and system-standby current poses a problem.

When the system is place in the low-power consumption mode or the memory cells M are not accessed, a mode switching control signal is externally applied to the MOS transistor Trm in order to turn off the MOS transistor Trm. When the voltage level at the node N3 in each of the memory cells M is low and the voltage level at the node N4 therein is high, an off-leakage current Ip2 flows between the source and drain of the MOS transistor Tp2 in each of the memory cells M, and an off-leakage current In1 flows between the drain and source of the MOS transistor Tn1 therein. Owing to the adverse effect of the off-leakage currents, the capacitors C1 and C2 are charged, and the potential at the node N2 is increased. Accordingly, the regulation circuit F determines a positive voltage to be applied to the node N2.

As a result of the operation of the current mirror circuit CM1, the regulation circuit F routes a constant current I a magnitude of which is determined by the MOS transistor Tr4 and resistor R3, to the MOS transistors Tr1, TrR, and Tr3. The step-down power supply circuit VG stably feeds a voltage determined by a ratio of resistances of the voltage division resistors R1 and R2, to the node N6. A voltage applied to the node N7 connected to the inverting input terminal of the operational amplifier OP2 is lower than the voltage at the node N6 by an amount of the threshold voltage Vt of the MOS transistor TrR.

For example, if the threshold voltage Vt of the MOS transistors Tn1 and Tn2 is high under a condition of low temperature, the threshold voltage Vt of the MOS transistor TrR is also high. The voltages at the nodes N7 and N2 are accordingly lowered. In contrast, when the threshold voltage Vt of the MOS transistors Tn1 and Tn2 is low under a condition of high temperature, the threshold voltage Vt of the MOS transistor TrR is low. The voltages at the nodes N7 and N2 are accordingly increased due to the operations of the step-down power supply circuit VG and the MOS transistor TrR. Thus, even if temperature or a variance caused by manufacture exerts an adverse effect, it can always be ensured that the transistor Tn2 has a constant margin for turning on.

FIG. 2 shows comparison of a margin for data preservation attained in the present embodiment with a margin for data preservation attained in accordance with related art. Assuming that the circuitry described in, for example, JP-A-2000-174611 is adopted as the related art, when a voltage is applied to the sources of n-channel MOS transistors in order to step up the source potential, leakage currents can be decreased. However, when the threshold voltage VTHO of the NMOS transistors is low, a voltage Vb to be applied to the sources tends to be low. When the threshold voltage VTHO of the NMOS transistors is high, the voltage Vb to be applied to the sources tends to be high. If, as illustrated in FIG. 2, the voltage Vb to be applied to the sources remains constant irrespective of a change in the threshold voltage VTHO, a change in the margin for turning on of the NMOS transistors derived from a variance caused by the temperature or manufacture becomes unavoidable.

In the present embodiment, even when the threshold voltage VTHO of the NMOS transistors of each of the memory cells M fluctuates, the regulation circuit F regulates a voltage applied to the sources of the NMOS transistors, so that the margin for turning on of the NMOS transistors can be retained at a certain value at all times.

According to the present embodiment, when the threshold voltage VTHO of the NMOS transistor Tn1 is low, the voltage Vb to be applied to the source is increased. When the threshold voltage VTHO of the NMOS transistor Tn1 is high, the voltage Vb to be applied to the source is decreased. Therefore, the margin for data preservation or the margin for turning on can be held nearly constant. When the NMOS transistor Tn1 is turned on, if the threshold voltage Vt is low and the off-leakage current of the NMOS transistor Tn1 is large, the regulation circuit F steps up a voltage to be applied to the node N2. Thus, increasing an effect of a bias voltage applied to the substrate of NMOS transistors. Compared with the related art, a leakage current value can be effectively decreased.

The MOS transistors TrR are fabricated under the condition of the same layout as the transistors Tn1 and Tn2 included in the memory cells M. When a constant current value is set to a value that is N times or multiple times larger, even if a variance caused by manufacture is observed among the MOS transistors TrR, the threshold voltage values Vt can be averaged in order to suppress the variance to the greatest possible extent for the purpose of stabilization.

Thus, a positive bias voltage is applied to the sources of the MOS transistors Tn1 and Tn2 whose back gates are grounded. The threshold voltage Vt of the MOS transistor Tn1 is increased, and a current flowing between the source and drain of the MOS transistor Tn1 decreases. Therefore, standby leakage currents can be decreased owing to the effect of a bias voltage applied to the substrate.

Only when leakage currents are present with the system placed in an off state or a standby state, the voltage at the node N2 is increased. Therefore, when the off-leakage currents are absent, the data preservation ability of each of the memory cells M will not be degraded unexpectedly.

According to the present embodiment, the MOS transistor TrR has the same structure as the NMOS transistors Tn1 and Tn2 included in each of the memory cells M. When the low-power consumption mode is designated, a voltage at the node N7, obtained by subtracting a voltage across the resistor R1 as a margin voltage for data preservation from a voltage applied to the node N1, and subtracting the threshold voltage Vt of the MOS transistor TrR from the resultant voltage, is stabilized and then applied to the node N2. Therefore, a current consumption required when the low-power consumption mode is designated can be suppressed. A nearly constant margin for turning on can be ensured at all times, irrespective of a variance in the MOS transistor Tn1 caused by a temperature or a process variation. As a data preserved state of each of the memory cells M, a state in which the voltage level at the node N3 is low and the voltage level at the node N4 is high has been described so far. In a similar manner that will be apparent to one of ordinary skill, a near constant margin can also be achieved in a state in which the voltage level at the node N3 is high and the voltage level at the node N4 is low and a description will therefore be omitted.

Since the multiple MOS transistors TrR are connected in parallel with one another, the threshold voltage values Vt of the MOS transistors TrR can be averaged in order to suppress an adverse effect of a variance among the MOS transistors TrR.

Since the MOS transistors Tn1, Tn2, and TrR are positioned side by side with one another in the memory cell region, the same layout structure can be readily formed. MOS transistors sharing the same characteristic can be readily fabricated.

According to the technological idea described in the patent document 1, when a fixed voltage is applied to the sources of NMOS transistors Tn1 and Tn2, circuitry has to be designed in consideration of a variance in the threshold voltage Vt. However, in the present embodiment, circuitry can be produced without the necessity of taking account of cell process characteristics.

According to the technological ideal described in the patent document 1, when a variance in the threshold voltage Vt is maximal, a voltage to be applied to the sources is often determined so that a desired margin voltage for data preservation can be ensured. When the threshold voltage is minimal, that is, when off-leakage currents are large, the margin for data preservation, that is, the margin for turning on of the memory transistors becomes excess. According to the present embodiment, the source potential can be increased and an effect of a bias voltage applied to a substrate can be effectively exerted, so that even when the threshold voltage Vt becomes minimal, that is, the off-leakage currents are large, the same margin for data preservation can be ensured. Compared with the related art, a greater effect of decreases in leakage currents can be exerted.

The regulation circuit F applies a voltage to the node N2 connected to the sources of the NMOS transistors Tn1 and Tn2 independently to the back gates thereof. Currents flowing through the NMOS transistors Tn1 and Tn2 can be readily regulated, and an effect of decreases in leakage currents can be intensified.

Second Embodiment

Figure 3:
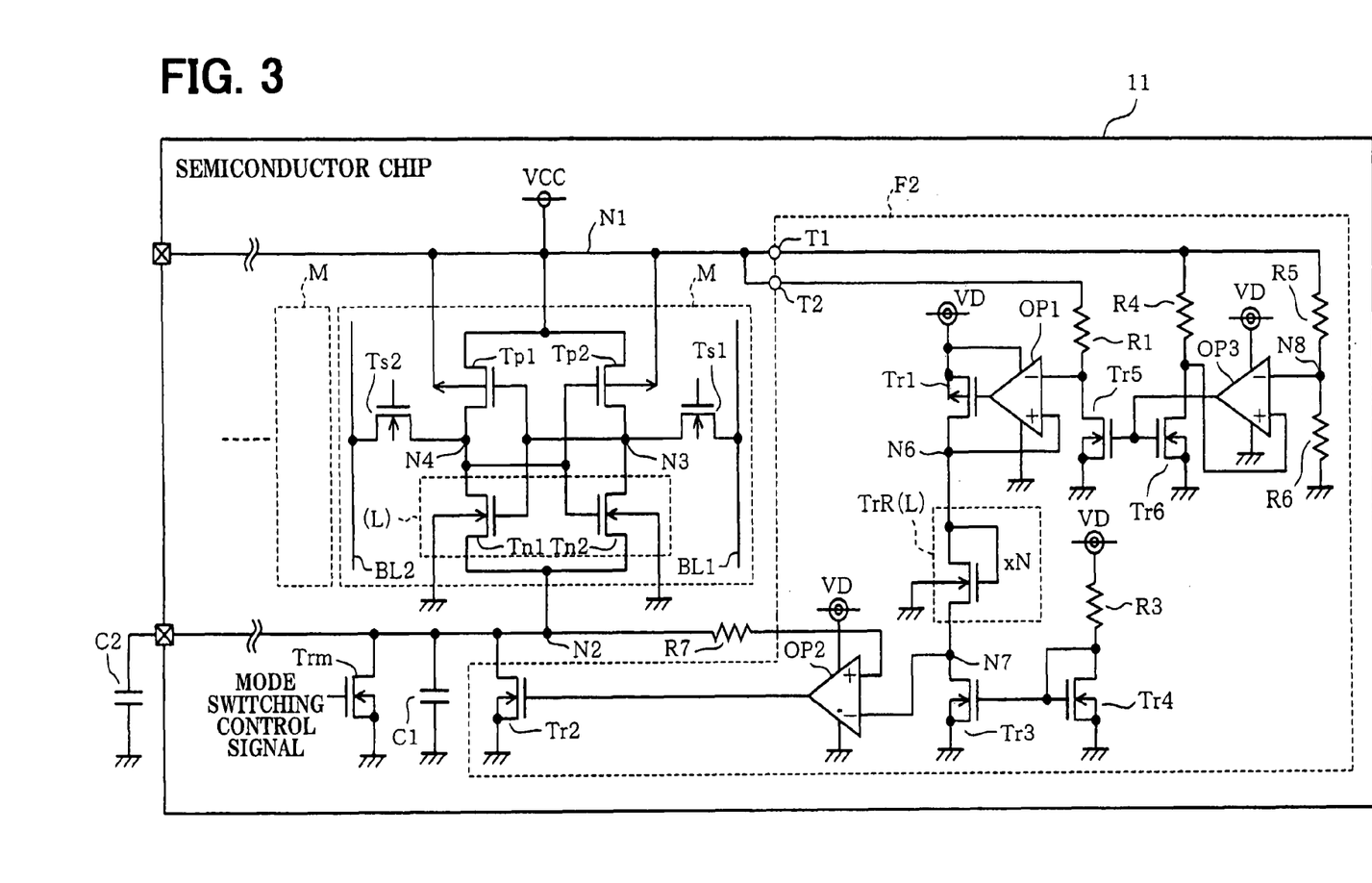
FIG. 3 is a schematic diagram illustrating an exemplary constitution of a semiconductor memory device in accordance with a second embodiment.

FIG. 3 shows a second embodiment. The same reference numerals are assigned to components identical to those of a first embodiment. A redundant description will be omitted, and a difference will be described below.

As shown in FIG. 3, a regulation circuit F2 is formed in a semiconductor chip 11, which, for example for comparison purposes, corresponds to the semiconductor chip 1 and the regulation circuit F described herein above. The regulation circuit F2 has an electrical constitution described below in addition to the electrical constitution of the regulation circuit F. An n-channel MOS transistor Tr5 is formed in place of the resistor R2. The drain of the MOS transistor Tr5 is connected to the resistor R1, and the source thereof is connected to a ground. A resistor R4 and the drain and source of an n-channel MOS transistor Tr6 are connected in series with one another between the node N1 and ground.

Resistors R5 and R6 for voltage division are also connected in series with each other between the node N1 and ground. A node N8 serving as a common junction point between the resistors is connected to the inverting input terminal of an operational amplifier OP3. The non-inverting input terminal of the operational amplifier OP3 is connected to a common junction point between the resistor 4 and MOS transistor TR6. The gates of the MOS transistors Tr5 and Tr6 are connected in common with each other, and the common junction point is connected to the output terminal of the operational amplifier OP3.

In the above described circuitry, a ratio of resistances of the resistors R5 and R6 is set to an predetermined value in order to establish a voltage at node N8 and the inverting input terminal of the operational amplifier OP3. The voltage at the node N8 is thereby fixed to a fractional voltage, for example, 0.9 V. The same voltage is applied to the gates of the MOS transistors Tr5 and Tr6 as long as the resistances of the resistors R1 and R4 are identical to each other and the voltage across the resistor R1 remains constant at all times. The voltage developed at the node N6 corresponds to the difference between a supply voltage VCC and the voltage across the resistor R1, and is retained at a constant value, for example, 0.9 V. The voltage across the resistor R1 is regarded as the margin voltage for data preservation, that is, the margin for turning on of the NMOS transistors, and is set to a value suitable for achieving data preservation.

The voltage at the node N7 corresponds to a voltage lower than the voltage at the node N6 by the threshold voltage Vt of the MOS transistor TrR, that is, the threshold voltage Vt of the NMOS transistors. The voltage developed at the node N2 when an off-leakage current is caused by the MOS transistors Tn1 and Tn2 is stably fixed to a value calculated according to the following expression: the voltage at N2=the supply voltage VCC−the voltage across the resistor R1−the threshold voltage value Vt of the MOS transistor Tn1 or Tn2.

Thus, even when the threshold voltage Vt of the memory cell transistors Tn1 and Tn2 varies depending on a process or temperature, a constant margin for data preservation can be ensured at all times. The margin voltage can be freely designated by determining the voltage to be developed at the node N8 according to the ratio of resistances of the resistors R5 and R6.

Third Embodiment

Figure 4:
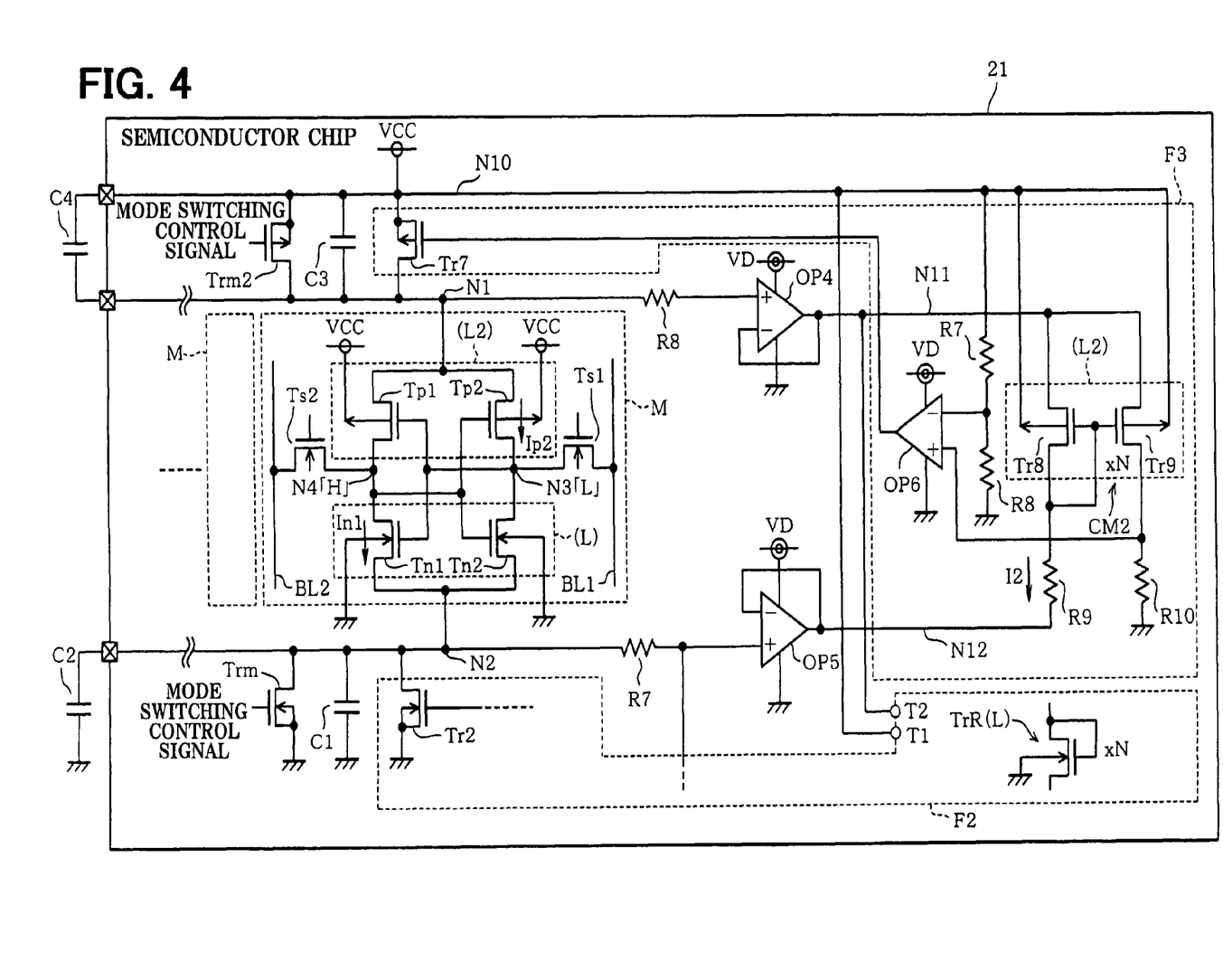
FIG. 4 is a schematic diagram illustrating an exemplary constitution of a semiconductor memory device in accordance with a third embodiment.
Figure 5A:
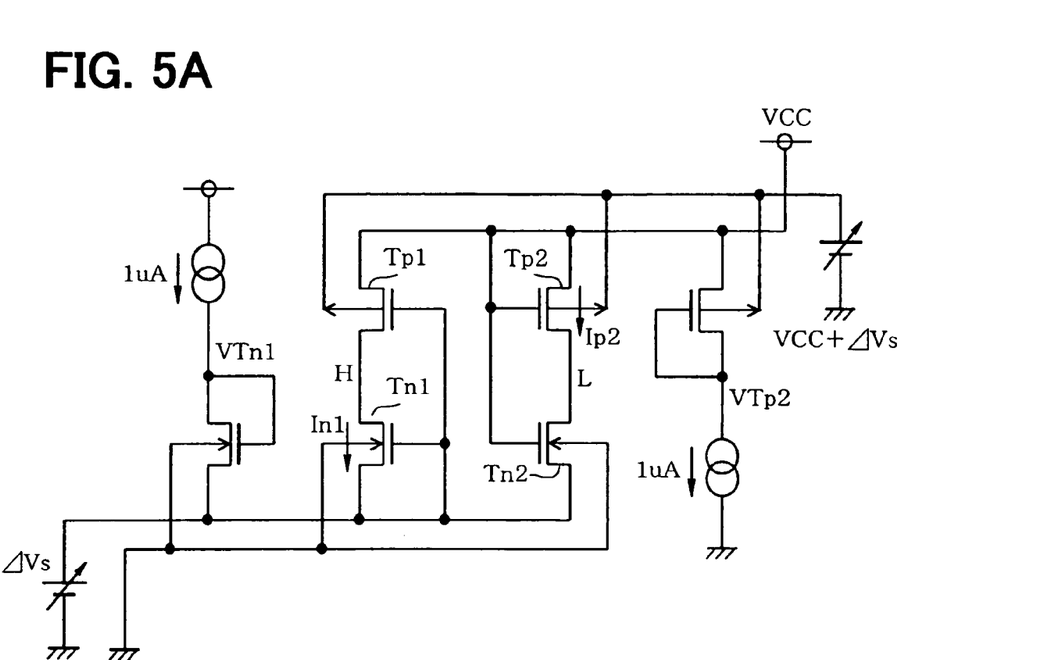
FIG. 5A is a circuit diagram illustrating an exemplary circuit simulating off-leakage current.
Figure 5B:
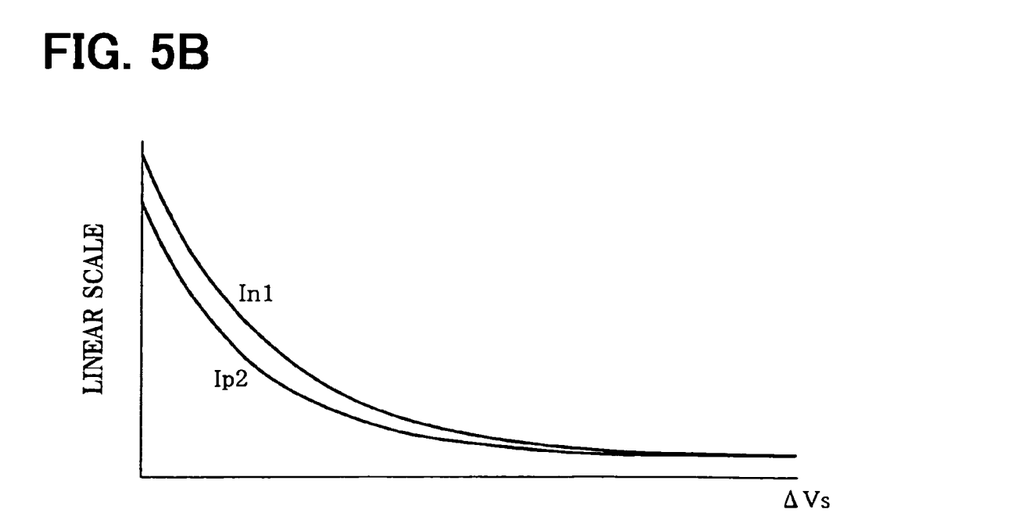
FIG. 5B is a graph illustrating an exemplary relationship between a voltage $\Delta Vs$ and currents In 1 and Ip 2 flowing through a transistor.

FIG. 4 to FIG. 5B show a third embodiment. A difference from the above described embodiments is that a bias voltage is applied to the node connected to the sources of the n-channel MOS transistors and also to the node connected to the sources of the p-channel MOS transistors included in each of the memory cells. Thus, a third embodiment is intended to exert an effect of reduction of leakage currents.

FIG. 4 shows a semiconductor chip 21, which, for example for comparison purposes, corresponds to the semiconductor chips 1 and 11. The regulation circuit F2 described in relation to the above described embodiment is formed in the semiconductor chip 21, and designed to apply a voltage to the node N2. In the above described embodiments, a connecting terminal T1 via which power is fed to the resistors R5 and R6 and a connecting terminal T2 via which power is fed to the resistor R1 are connected to the power feeding node N1 through which a supply voltage VCC is fed. In the present embodiment, the connecting terminal T1 is electrically connected to a power feeding node N10, and the connecting terminal T2 is connected to the output terminal of a voltage follower realized with the operational amplifier OP4.

The node N1 serves as a common junction point between the sources of the MOS transistors Tp1 and Tp2. Node N10 serves as a supply voltage VCC feeding node. A MOS transistor Trm2, acting as a mode switching element in a manner similar to that described above in connection with the MOS transistor Trm, is connected between the node N1 and node N10. A capacitor C3 is connected between the node N1 and node N10 in the semiconductor chip 21, and a capacitor C4 is connected outside the semiconductor chip 21. When the low-power consumption mode is designated or the RAMs are not accessed, the MOS transistor Trm2 is turned off.

A regulation circuit F3 is formed between the node N1 and node N10. The regulation circuit F3 includes operational amplifiers OP4 to OP6, resistors R7 to R10, and p-channel MOS transistors Tr7 to Tr9. A voltage proportional to the voltage developed at the node N2 is applied to the node N1. The operational amplifier OP4 inputs the voltage at the node N1 through the non-inverting input terminal thereof via the resistor R8 and feeds the output voltage associated with node N11 back to the inverting input so as to realize a voltage follower configuration. The operational amplifier OP5 inputs a voltage developed at the node N2 through the non-inverting input terminal thereof via the resistor R7 and feeds the output voltage associated with node N12 back to the inverting input so as to realize a voltage follower configuration.

A p-channel MOS transistor Tr8, functioning, for example, as a diode, and a resistor R9 are connected in series with each other between the output node N11 of the operational amplifier OP4 and the output node N12 of the operational amplifier OP5. The back gates of the MOS transistor Tr8 and Tr9 are connected to the node N10. The gates and sources of the MOS transistors Tr8 and Tr9 are connected in common with each other. The drain of the PMOS transistor Tr9 is connected to the ground via the resistor R10. The resistors R9 and R10 and the MOS transistors Tr8 and Tr9 constitute a current mirror circuit CM2.

The pairs of the PMOS transistors Tr8 and Tr9 are formed in the memory cell region in a manner similar to the MOS transistors TrR described in relation to the above described embodiments. The pairs of the PMOS transistors Tr8 and Tr9 are positioned side by side with the pairs of the PMOS transistors Tp1 and Tp2 in the memory cell region, are manufactured in the same process as the pairs of the PMOS transistors Tp1 and Tp2, and have the same layout structure as the pairs of PMOS transistors Tp1 and Tp2. The layout of each pair of the PMOS transistors Tp1 and Tp2, and the layout of each pair of the PMOS transistors Tr8 and Tr9 are identical such that the characteristics of the PMOS transistors are nearly identical. Therefore, a reference numeral L2 in parentheses shared between the two blocks as shown in the figure.

The common junction point between the PMOS transistor Tr9 and resistor R10 is connected to the non-inverting input terminal of the operational amplifier OP6. The resistors R7 and R8 are connected in series with each other between the node N10 and ground. The common junction point between the resistors R7 and R8 is connected to the inverting input terminal of the operational amplifier OP6. The output terminal of the operational amplifier OP6 is connected to the gate of the p-channel MOS transistor Tr7. The source and drain of the MOS transistor Tr7 are connected between the node N10 and node N1. As will be appreciated by one of ordinary skill, the other electrical connections are nearly identical to those of the above described embodiments and therefore a redundant description will be omitted.

An operation of the foregoing constitution will be described below. When the system is placed in the low-power consumption mode or the memory cells M are not accessed, the MOS transistors Trm and Trm2 are turned off along with application of an external mode switching control signal to the gates of the MOS transistors Trm and Trm2. Similar to the above described embodiments, when the voltage level at the node N3 in each of the memory cells M is low and the voltage level at the node N4 therein is high, an off-leakage current Ip2 flows between the source and drain of the PMOS transistor Tp2 in each of the memory cells M, and an off-leakage current In1 flows between the drain and source of the NMOS transistor Tn1.

The capacitors C1 to C4 are charged due to an adverse effect of the leakage currents. The potential at the node N2 gets higher than 0 V, and the potential at the node N1 gets lower than the supply voltage VCC. When the low-power consumption mode is designated, since the supply voltage VCC is applied as a back bias—a bias voltage to be applied to the substrate—to the back gate of the PMOS transistor Tp2, the PMOS transistor Tp2 is forcibly turned off in a manner similar to the NMOS transistor Tn1 and the off-leakage currents can be further decreased. The voltage between the node N1 and node N2 can be made lower than that in the above described embodiments and the off-leakage currents can be minimized.

FIG. 5A shows a circuit used to simulate an effect of decreases in off-leakage currents and FIG. 5B is a graph that shows the dependency of the off-leakage currents flowing through the respective transistors on a back gate voltage. As shown in FIG. 5A and FIG. 5B, when a bias voltage, that can be expressed as VCC+ΔVs, and that can be applied to the back gate of the PMOS transistor Tp2, is higher than the voltage VCC applied to the sources of the PMOS transistors Tp1 and Tp2, the current Ip2 flowing between the source and drain of the PMOS transistor Tp2 decreases exponentially with respect to an increase in the value of ΔVs. When the voltage ΔVs applied to the source of the NMOS transistor Tn1 is higher than a ground potential voltage of 0V applied to the back gate of the NMOS transistor Tn1, the current In1 flowing between the drain and source of the transistor Tn1 decreases exponentially with respect to an increase in the value of ΔVs.

With reference again to FIG. 4, the regulation circuit F2 uses the MOS transistor Tr2 to control the potential at the node N2, and the regulation circuit F3 uses the MOS transistor Tr7 to control the potential at the node N1. Since the operation of the regulation circuit F2 is identical to that in the above described embodiment, a redundant description will be omitted. The regulation circuit F3 determines the voltage between the node N11 and N12 according to the resistance of the resistor R9 and the voltage between the source and drain of the MOS transistor Tr8.

For example, if the threshold voltage Vt of the MOS transistor Tp2 is high, the threshold voltage Vt of the MOS transistors Tr8 and Tr9 is also high and the current I2 flowing into the resistor R9 correspondingly decreases. When the current I2 decreases, a current flowing into the resistor R10 also decreases and a voltage to be applied to the non-inverting input terminal of the operational amplifier OP6 is therefore reduced. A voltage to be applied to the gate of the MOS transistor Tr7 is reduced and the potential at the node N1 is increased. In contrast, when the threshold voltage Vt of the MOS transistors Tp2 is low, the threshold voltage Vt of the MOS transistors Tr8 and Tr9 is also low and a voltage to be applied to the non-inverting input terminal of the operational amplifier OP6 is increased. Eventually, a constant margin for turning on can be ensured at all times despite a change in the threshold voltage resulting from an effect of temperature or a variation caused by manufacture.

According to the present embodiment, the regulation circuit F3 regulates a voltage to be applied to the node N1 according to a voltage to be applied to the node N2, and the regulation circuit F2 regulates the voltage to be applied to the node N2 according to the voltage to be applied to the node N1, and then applies the resultant voltage. Accordingly the source potential of the NMOS transistors and also the source potential of the PMOS transistors Tp2 can be reduced to a value lower than the supply voltage. The current IP2 flowing through the PMOS transistors Tp2 can be decreased.

It should be noted that the pair of the PMOS transistors Tr8 and Tr9 has the same layout structure (L2) as the pair of the PMOS transistors Tp1 and Tp2 included in each of the memory cells M. The regulation circuit F3 uses the voltage developed at the node N2 to ensure a margin voltage for turning on of the PMOS transistors Tp1 or Tp2 according to a current flowing into the resistor R9, and regulates a voltage applied to the gate of the PMOS transistor Tr7, on the basis of a voltage proportional to the current I2 flowing through the current mirror circuit CM2. Therefore, the source potential of the PMOS transistors Tp2 can be made lower than the supply voltage VCC. While the margin for turning on of the PMOS transistor Tp1 is controlled to remain constant, or remain at the same voltage as the voltage across each of the resistors R9, R10, and R8, the off-leakage current IP2 flowing through the PMOS transistor Tp2 can be decreased.

The regulation circuit F3 applies a voltage to the node N1 connected to the sources of the PMOS transistors Tp1 and Tp2 independently of the back gates thereof, and can therefore readily regulate currents flowing through the PMOS transistors Tp1 and Tp2. An effect of decreases in leakage currents can be intensified.

Fourth Embodiment

Figure 6:
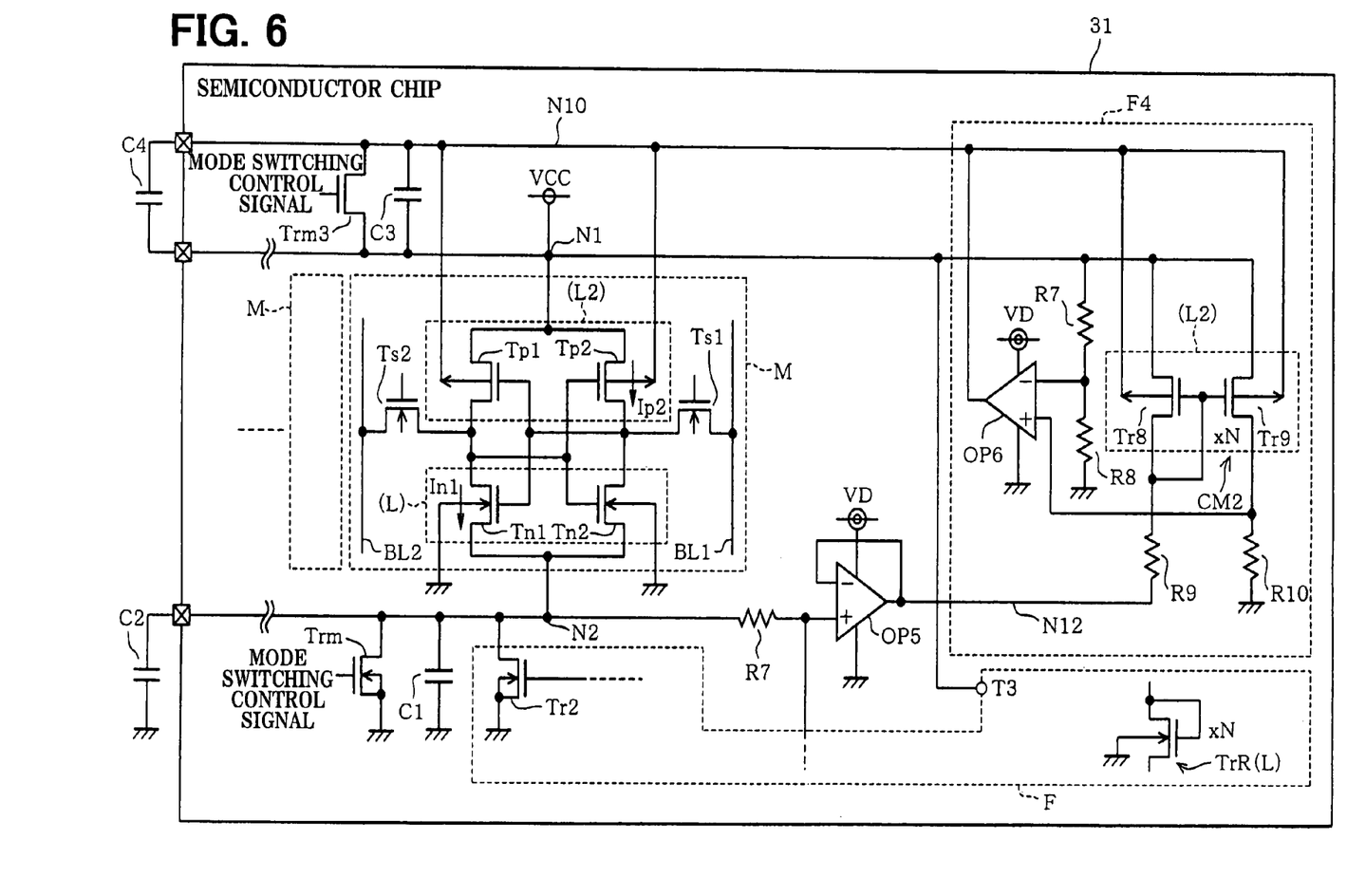
FIG. 6 is a schematic diagram illustrating an exemplary constitution of a semiconductor memory device in accordance with a fourth embodiment.

FIG. 6 shows a fourth embodiment. A difference from the above described embodiments is that a voltage to be applied to the back gates of p-channel MOS transistors is controlled. The same reference numerals are assigned to components identical to those of the above described embodiments. A redundant description will be omitted and the difference will be described below.

FIG. 6 schematically shows the electrical constitution of a semiconductor chip 31, which, for example for comparison purposes, corresponds to the semiconductor chips 1, 11, and 21. As shown in FIG. 6, a regulation circuit F4 is formed in place of the regulation circuit F3. Unlike the regulation circuit F3, the regulation circuit F4 does not have a voltage follower formed with the operational amplifier OP4. A MOS transistor Trm3 is for mode switching similar to the transistors Trm and Trm2 described above, the source and drain connected between the node N1 and node N10.

The supply voltage VCC is fed to the node N1. The back gates of the PMOS transistors Tp2 and Tp1 are connected to the node N10. The output terminal of an operational amplifier OP6 is connected to the node N10. The node N1 is connected to the resistor R7, and also connected to the sources of the PMOS transistors Tr8 and Tr9. A terminal T3 of the regulation circuit F, described in relation to a first embodiment, is connected to the node N1 in the circuitry shown in FIG. 6. While the supply voltage VCC is applied to the sources of the PMOS transistors Tp1 and Tp2, a voltage is applied to the back gates of the MOS transistors Tp1 and Tp2 via the operational amplifier OP6. The voltage at the node N10 is controlled according to how the operational amplifier OP6 is controlled. The voltage to be applied to the back gates of the PMOS transistors Tp1 and Tp2 is controlled so that the margin for turning on of the PMOS transistor Tp1 or Tp2 will remain constant at all times and nearly the same operation and advantage as the above described embodiments are provided.

In the above described embodiments, a bias voltage is applied to the node connected to the sources of the n-channel MOS transistors Tn1 and Tn2. In addition, the bias voltage is applied to the node connected to the sources of the p-channel MOS transistors Tp1 and Tp2 included in each of the memory cells. The present invention can also be applied to a mode in which the bias voltage is applied only to the node connected to the sources of the p-channel MOS transistors Tp1 and Tp2.

Figure 7:
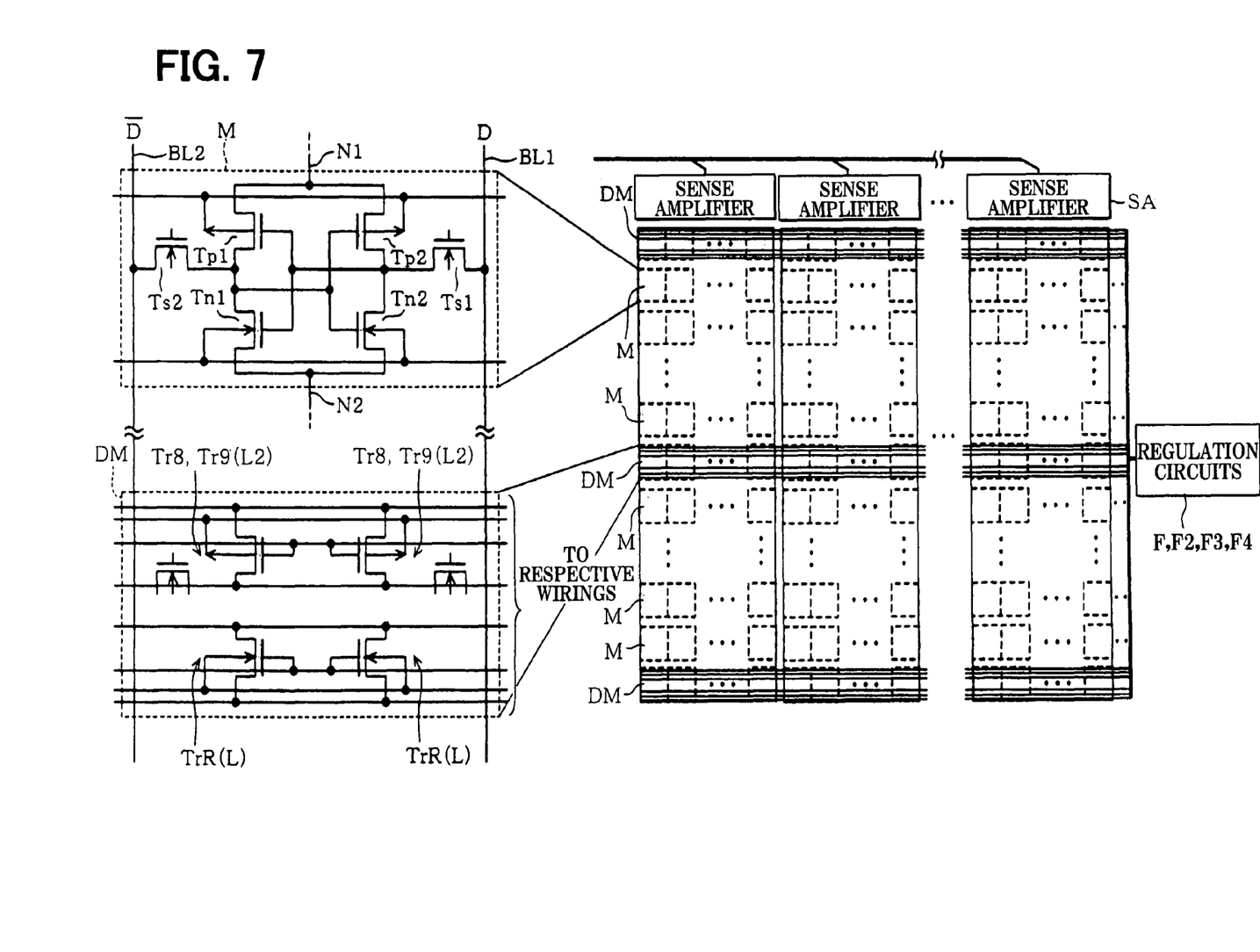
FIG. 7 is a diagram illustrating a plan view of an exemplary structural layout associated with a first to a fourth embodiment.

FIG. 7 shows an example of a layout structure of a memory cell region for the purpose of supplementing the explanation of the above described embodiments. As shown in FIG. 7, a sense amplifier SA senses data in each of the memory cells M. The numerous memory cells M are placed side by side in the form of a matrix. Multiple dummy memory cells DM having the same structure as the memory cells M are disposed adjacently. The dummy memory cells DM are arrayed in a predetermined direction. The transistors TrR, Tr8, and Tr9 described in relation to the embodiments are formed in each of the dummy memory cells DM. The above described regulation circuits F to F4 are formed in conjunction with the transistors Tr8, Tr9, and TrR. By adopting such a layout structure, the characteristic of the PMOS transistors Tp1 and Tp2 and the characteristic of the PMOS transistors Tr8 and Tr9 are easily duplicated so as to be made nearly equal. Further, the characteristic of the NMOS transistors Tn1 and Tn2 and the characteristic of the NMOS transistor TrR are easily duplicated so as to be made nearly equal.

What is claimed is:

1. A semiconductor memory device comprising:
static random-access memory (SRAM) cells each including memory cell transistors; and
a regulation circuit that regulates a voltage applied to one of sources and back gates of the memory cell transistors based on a level of fluctuation of a threshold voltage of the memory cell transistors so as to retain a margin for turning on the memory cell at a constant value.

2. The semiconductor memory device according to claim 1, wherein the memory cell transistors include PMOS transistors and wherein the regulated voltage is applied independently to one of the sources of the PMOS transistors and the back gates of the PMOS transistors.

3. The semiconductor memory device according to claim 2, wherein the memory cell transistors further include NMOS transistors and wherein the regulated voltage is further applied independently to one of the sources of the NMOS transistors and the back gates of the NMOS transistors.

4. The semiconductor memory device according to claim 1, wherein the memory cell transistors include NMOS transistors and wherein the regulated voltage is applied independently to one of the sources of the NMOS transistors and the back gates of the NMOS transistors.

5. The semiconductor memory device according to claim 1, wherein the SRAM cells include a thin-film silicon-on-insulator (SOI) structure.

6. A semiconductor memory device comprising:
static random-access memory (SRAM) cells each including memory cell transistors;
detection circuits that detect a level of fluctuation of a threshold voltage of the memory cell transistors included in the SRAM cells to produce a detection result; and
a regulation circuit that regulates a voltage applied to one of sources and back gates of the memory cell transistors on the basis of the detection result of the detection performed by the detection circuits so as to retain a margin for turning on the memory cell at a constant value.

7. The semiconductor memory device according to claim 6, wherein the memory cell transistors include PMOS transistors and wherein the regulated voltage is applied independently to one of the sources of the PMOS transistors and the back gates of the PMOS transistors.

8. The semiconductor memory device according to claim 6, wherein the memory cell transistors include NMOS transistors and wherein the regulated voltage is applied independently to one of the sources of the NMOS transistors and the back gates of the NMOS transistors.

9. The semiconductor memory device according to claim 6, wherein the SRAM cells include a thin-film silicon-on-insulator (SOI) structure.

10. A semiconductor memory device comprising:
static random-access memory (SRAM) cells each including: a first PMOS transistor and a second PMOS transistor, a source of the first PMOS transistor and the second PMOS transistor being connected in common at a first node, and a first NMOS transistor and a second NMOS transistor, a source of the first NMOS transistor and the second NMOS transistor being connected in common at a second node, wherein the first PMOS transistor and the first NMOS transistor are connected to each other as a CMOS inverter, and the second PMOS transistor and the second NMOS transistor connected to each other as a CMOS inverter;
third NMOS transistors having the same structure as the first NMOS transistors and the second NMOS transistors associated with each of the SRAM cells; and
a first voltage application circuit that applies to the second node a voltage that is regulated on the basis of a level of fluctuation of a threshold voltage of the third NMOS transistors when a low-power consumption mode is designated so as to retain a margin for turning on the memory cell at a constant value.

11. The semiconductor memory device according to claim 10, wherein a plurality of the third NMOS transistors is connected in parallel with one another.

12. The semiconductor memory device according to claim 10, wherein the first to third NMOS transistors are arrayed in a memory cell region.

13. The semiconductor memory device according to claim 10, wherein the first voltage application circuit applies a voltage higher than a voltage to be applied to the back gate of the first NMOS transistor and to the back gate of the second NMOS transistor, to the second node.

14. The semiconductor memory device according to claim 10, wherein the first voltage application circuit includes a second voltage application circuit that applies a voltage to the first node according to a voltage to be applied to the second node.

15. The semiconductor memory device according to claim 14, wherein the second voltage application circuit includes third PMOS transistors having the same layout structure as the first and second PMOS transistors, the second voltage application circuit applying a voltage to the first node on the basis of the threshold voltage of the third PMOS transistors.

16. The semiconductor memory device according to claim 15, wherein a plurality of the third PMOS transistors are connected in parallel with one another.

17. The semiconductor memory device according to claim 15, wherein the first to the third PMOS transistors are arrayed in a memory cell region.

18. The semiconductor memory device according to claim 14, wherein the second voltage application circuit applies a voltage lower than a voltage to be applied to a back gate of the first PMOS transistor and to a back gate of the second PMOS transistor, to the first node.

19. The semiconductor memory device according to claim 10, wherein the SRAM cells include a thin-film silicon-on-insulator (SOI) structure.

* * * * *